US011394865B1

(12) United States Patent
Le et al.

(10) Patent No.: US 11,394,865 B1
(45) Date of Patent: Jul. 19, 2022

(54) LOW-POWER, FAST-RESPONSE MACHINE LEARNING AUTOFOCUS ENHANCEMENTS

(71) Applicant: Western Digital Technologies, Inc., San Jose, CA (US)

(72) Inventors: Quang Le, San Jose, CA (US); Rajeev Nagabhirava, Santa Clara, CA (US); Kuok San Ho, Redwood City, CA (US); Daniel Bai, Freemont, CA (US); Xiaoyong Liu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/360,373

(22) Filed: Jun. 28, 2021

(51) Int. Cl.
*H04N 5/232* (2006.01)
*H01L 27/22* (2006.01)

(52) U.S. Cl.
CPC ... *H04N 5/232121* (2018.08); *H04N 5/23218* (2018.08); *H04N 5/23258* (2013.01); *H01L 27/222* (2013.01)

(58) Field of Classification Search
CPC ......... H04N 5/232121; H04N 5/23218; H04N 5/23258; H04N 5/23238; H04N 5/23206; H04N 5/23296; H04N 5/217; H04N 5/3572; H04N 5/232945; H04N 5/23216; H04N 5/23299; H04N 5/232123; H04N 5/783; H04N 19/124; H04N 19/126; H04N 19/14; H04N 19/174; H04N 19/17; H04N 19/23; H04N 19/196; H04N 19/172; H04N 19/61; H04N 19/149; H04N 19/146; H04N 7/183; H04N 7/141; H04N 7/188; H04N 7/181;
(Continued)

(56) References Cited

U.S. PATENT DOCUMENTS 7,167,519 B2  1/2007 Comaniciu et al.
8,427,538 B2  4/2013 Ahiska
(Continued)

OTHER PUBLICATIONS

Chen, R. et al, "Improving the accuracy and low-light performance of contrast-based autofocus using supervised machine learning", Pattern Recognition Letters, vol. 56, Apr. 15, 2015, pp. 30-37.
(Continued)

*Primary Examiner* — Pritham D Prabhakher
(74) *Attorney, Agent, or Firm* — Ravi Mohan; Rutan & Tucker, LLP

(57) ABSTRACT

Computing devices, such as mobile computing devices, have access to one or more image sensors that can capture images with multiple subjects. Some of these subjects may be known to the user capturing an image with the image sensor. The user may prefer to have the captured image data be optimized around the known subjects. Low-power, fast-response machine learning logic can be configured to allow for the generation of a plurality of inference data. This inference data can be utilized along with other sensor data, such as a motion sensor, for the generation of one or more image sensor configuration changes that may be implemented to optimize the subsequent capture of image data. This cycle of image data analysis, image sensor optimization, and subsequent capture can continue multiple times until a threshold of optimization or time is met. The captured image data optimized around the known subjects is then stored.

22 Claims, 9 Drawing Sheets

(58) Field of Classification Search
CPC ..... H04N 9/8042; H01L 27/222; G06T 5/006; G06T 2207/10016; G06T 2207/30241; G06T 2207/30232; G06T 2207/10032; G06T 7/20; G06V 20/52; G08B 13/19641; G03B 15/16; G03B 15/006; G03B 13/36; G03B 37/00
USPC .......................................................... 348/348
See application file for complete search history.

(56) References Cited

U.S. PATENT DOCUMENTS

| | | | |
|---|---|---|---|
| 8,472,798 | B2 | 6/2013 | Molin et al. |
| 8,830,339 | B2 | 9/2014 | Velarde et al. |
| 11,048,919 | B1* | 6/2021 | Modolo ................. G06V 20/40 |
| 11,048,973 | B1* | 6/2021 | Ramanathan .......... G06V 20/40 |
| 11,227,388 | B2* | 1/2022 | Pang ....................... G06V 20/17 |
| 11,232,554 | B1* | 1/2022 | Do .......................... G06T 7/248 |
| 2020/0007746 | A1 | 1/2020 | Cao et al. |
| 2020/0057881 | A1* | 2/2020 | Zhang ..................... G06V 20/17 |
| 2020/0349704 | A1* | 11/2020 | Pang ......................... G06T 5/20 |
| 2020/0382697 | A1* | 12/2020 | Nagao ..................... G06V 10/50 |
| 2021/0127068 | A1* | 4/2021 | Nishiyama ....... H04N 5/232127 |
| 2021/0158537 | A1* | 5/2021 | Funamoto ................. G06T 7/20 |
| 2021/0176405 | A1* | 6/2021 | Ishii .................... H04N 5/23245 |
| 2021/0241443 | A1* | 8/2021 | Takahashi .......... H04N 5/23222 |
| 2021/0256823 | A1* | 8/2021 | Ito ........................... G06V 40/23 |
| 2021/0390716 | A1* | 12/2021 | Zhang ........................ G06T 7/32 |

OTHER PUBLICATIONS

James, A. et al., "Smart cameras everywhere: AI vision on edge with emerging memories," 2019 26th IEEE International Conference on Electronics, Circuits and Systems (ICECS), 2019, pp. 422-425, doi: 10.1109/ICECS46596.2019.8965029.

Kim, Y. et al, "ORCHARD: Visual Object Recognition Accelerator Based on Approximate In-Memory Processing" 2017 IEEE.

Mudassar, B. A. et al., "CAMEL: An Adaptive Camera With Embedded Machine Learning-Based Sensor Parameter Control," in IEEE Journal on Emerging and Selected Topics in Circuits and Systems, vol. 9, No. 3, pp. 498-508, Sep. 2019. doi: 10.1109/JETCAS.2019.2935207.

Pen, Liang, "Enhanced Camera Capturing Using Object-Detection-Based Autofocus on Smartphones", 2016 4th Intl Conf on Applied Computing and Information Technology/3rd Intl Conf on Computational Science/Intelligence and Applied Informatics/1st Intl Conf on Big Data, Cloud Computing, Data Science & Engineering.

Wang, C. et al., "Intelligent Autofocus", Feb. 27, 2020.

* cited by examiner

FIG. 3

LOW-POWER, FAST-RESPONSE MACHINE LEARNING AUTOFOCUS ENHANCEMENTS

FIELD

The present disclosure relates to image processing. More particularly, the present disclosure relates to utilizing low-power, artificial intelligence-based systems to provide fast-response autofocus enhancements for capturing optimized images.

BACKGROUND

As technology has grown over the last decade, the growth of image data such as photographic content has increased dramatically, especially with the advent of mobile computing devices with built-in image sensors. This increase in image data has generated a greater demand for automatic classification and optimization, especially as image data is captured with one or more subjects known to the person capturing the image. In response, neural networks and other artificial intelligence methods have been increasingly utilized to generate automatic classifications, detections, and other optimizations.

However, as image data and the neural networks used to analyze them have increased in size and complexity, a higher computational and power demand is created. More data to process requires more time to process all of the data. Likewise, more complex neural networks require more processing power to parse the data. Traditional methods of handling these problems include trading a decrease in output accuracy for increased processing speed, or conversely, increasing the output accuracy for a decrease in processing speed.

SUMMARY

Systems and methods for optimizing image data utilizing low-power, fast-response machine learning logic in accordance with embodiments of the invention are disclosed herein. In many embodiments, a device includes an image sensor, a Non-Volatile Memory (NVM) for storing data and executable instructions, and a processor communicatively coupled to the NVM. The processor can be configured to direct the device to receive image data for processing and pass the received image data to a machine learning model which can recognize a known subject within the image data, generate a plurality of inferences, and utilize the plurality of inferences to generate image optimization data. The image optimization data includes one or more image sensor configurations for optimizing an area within the image data associated with the known subject during subsequent image data captures.

In further embodiments, the processor includes a machine learning processor itself comprising a plurality of non-volatile memory cells to store weights for the machine learning model, and wherein the machine learning processor is configured to apply signals corresponding to the received image data, via one or more signal lines associated with the memory cells, to the memory cells, to generate the plurality of inferences.

In more embodiments, the non-volatile memory cells are Spin-Orbit Torque Magnetoresistive Random-Access Memory (SOT MRAM) memory cells.

In additional embodiments, the device is also configured with a motion sensor to receive motion data from the motion sensor and generate the image optimization data based on the plurality of inferences and the received motion data.

In still further embodiments, the device is configured to continue capturing image data until the optimization of the known subject within the image data exceeds a predetermined threshold.

In still additional embodiments, the image data is captured in discrete units.

In yet further embodiments, the device generates unique image optimization data between each discrete unit of image data captures.

In a series of embodiments, the predetermined threshold is related to the focus of the known subject within the image data.

In various embodiments, the device is also configured to recognize two or more known subjects within the image data and generate image optimization data including one or more image sensor configurations for optimizing areas of the image data associated with the two or more known subjects.

In a number of embodiments, the area associated with the known subject is a bounding box encasing the known subject.

In more embodiments, the area associated with the known subject is a mask covering the known subject.

In still more embodiments, a method for generating machine-learning based image optimization data includes receiving image data and passing the received image data to a low-power, fast-response machine learning model. Then, the model can recognize one or more known subjects within the image data, determine a known subject area for optimization based on the one or more known subjects, and generate a plurality of inferences via the machine learning model. The device can further utilize the plurality of inferences to generate image optimization data including one or more image sensor configurations for optimizing the known subject area within the image data, providing the image optimization data to an image sensor for capturing subsequent image data, and processing subsequently received image data until a predetermined optimization threshold is exceeded.

In further additional embodiments, the optimization includes improving the focus of the known subject area.

In still more embodiments, the low-power, fast-response machine learning model is executed in a plurality of Magnetoresistive Random-Access Memory (MRAM) based machine learning devices.

In another series of embodiments, the generation of the plurality of inferences is completed in less than one millisecond.

In certain embodiments, a device, includes a Non-Volatile Memory (NVM) for storing data and executable instructions, and a processor communicatively coupled to the NVM. The processor can be configured to direct the device to receive image data for processing, pass the received image data to a machine learning model, which can then recognize a known subject within the image data, generate a plurality of inferences, utilize the plurality of inferences to generate image optimization data. The image optimization data can include one or more image sensor configurations for optimizing image data capture areas associated with the known subject.

In yet more embodiments, the processor includes a machine learning processor comprising a plurality of non-volatile memory cells to store weights for the machine learning model, and wherein the machine learning processor is configured to apply signals corresponding to the received image data, via one or more signal lines associated with the memory cells, to the memory cells, to generate the plurality of inferences.

In more various embodiments, the image sensor includes a plurality of varying focal length image sensors.

In additional embodiments again, the image sensor also includes a Light Detection and Ranging (LiDAR) camera In still yet further embodiments, an image sensor array is disposed within a mobile computing device.

In yet additional embodiments, the known subject is selected via an input received by the mobile computing device.

Although the description above contains many specificities, these should not be construed as limiting the scope of the invention but as merely providing illustrations of some of the presently preferred embodiments of the invention. Various other embodiments are possible within its scope. Accordingly, the scope of the invention should be determined not by the embodiments illustrated, but by the appended claims and their equivalents.

BRIEF DESCRIPTION OF DRAWINGS

The above, and other, aspects, features, and advantages of several embodiments of the present disclosure will be more apparent from the following description as presented in conjunction with the following several figures of the drawings.

FIG. 3 depicts the conceptual process of generating optimized image data in accordance with an embodiment of the disclosure;

Figures 1A, 1B:
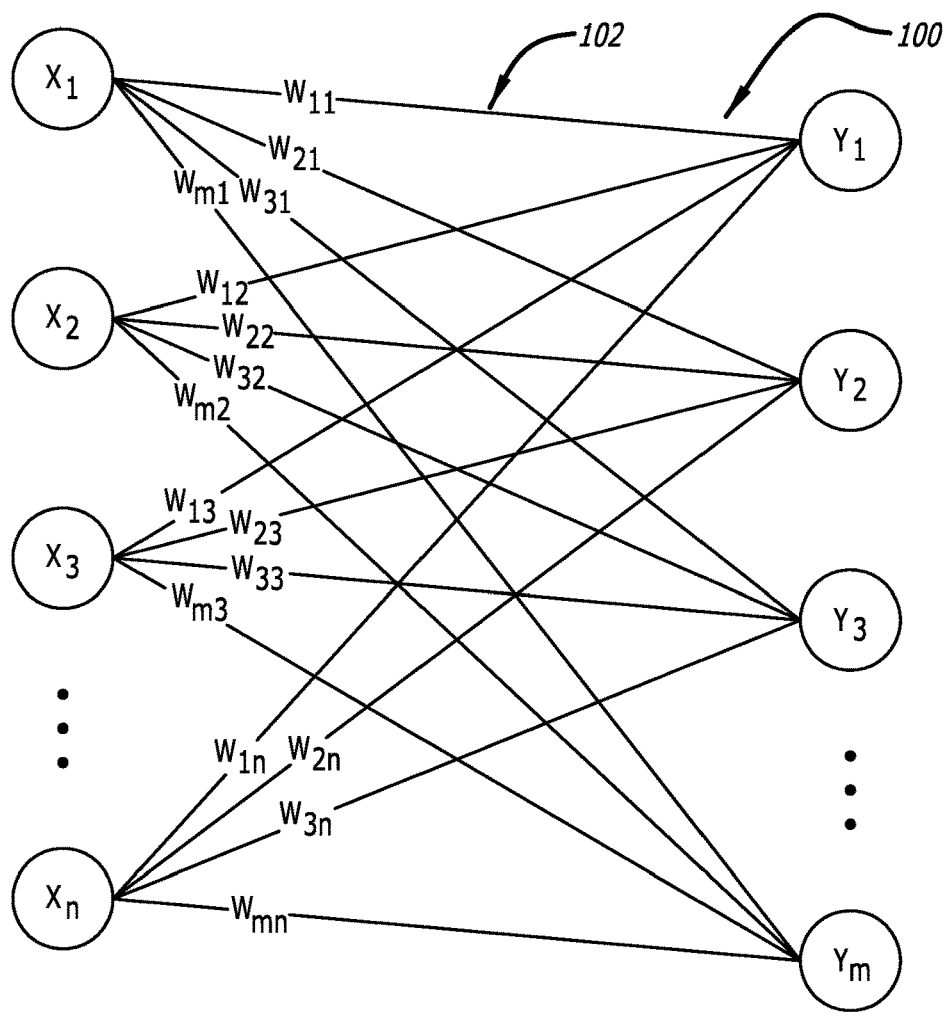
FIG. 1A is conceptual diagram of an artificial neural network in accordance with an embodiment of the disclosure.
FIG. 1B depicts a matrix-vector multiplication operation of the artificial neural network of FIG. 1A in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that optimize known subjects within captured image data during the image capture process. As those skilled in the art will recognize, many computing devices, including mobile computing devices include one or more image sensors for capturing image data. For example, a mobile phone can have an image sensor array that can be used to take photographs selected by a user. The user may know or have a preference for one or more subjects within the image captured by the image data. Conventional image capturing processes may attempt to optimize the image data as a whole or on a predetermined area. However, when presented with multiple subjects, conventional methods of image data optimization do not discern one subject from another insofar as a subject within the image data may be known to a user.

A user may attempt to capture image data associated with an event wherein a number of subjects are captured. For example, a user may take a photograph of their child playing in a soccer game with other children. In many instances, a user may prefer that the image data captured be optimized the area associated with their child, even at the expense of optimization of other children if needed. The methods of optimizing image data being captured typically utilizes machine learning logic (i.e., artificial neural networks) to process the data in a sufficient speed.

However, traditional methods of machine learning logic require both too much time to process captured image data in time to adjust and optimize further image data capture during an image data capture cycle (i.e., the time to take a photograph), and utilize levels of power that become prohibitive for use in mobile computing devices. However, as described in more detail below, specialized low-power, fast-response machine learning logic can be utilized to allow for generating a plurality of inferences that can further be used for optimizing image data during the capture process. Specifically, a device utilizing this low-power, fast-response machine learning logic can detect multiple subjects within received image data, discern whether one or more of those subjects is known to the user, and then optimize the image capture process around the area of the image data associated with the one or more known subjects.

In some embodiments, one or more sensors available to the device, such as for example a motion sensor, can also be utilized along with the plurality of inferences to generate optimization data for adjusting an image sensor for capturing more optimized image data. This cycle of inference generation, optimization changes, and subsequent image data capture and evaluation can continue a number of times until a predetermined number of cycles has occurred or a threshold level of optimization has been achieved. The determination of when to end the image capture and optimization cycle can also occur upon the change of image data. For example, if the user taking the image moves their mobile computing device away from the subjects, the moment being captured may be over and the large change in data between image capture cycles can be detected and utilized to determine that the current image capture and optimization cycle should end.

The determination of known subjects within the device can occur manually from the user, or from other data mining methods. For example, a mobile computing device with an available image sensor may have one or more previously captured images stored within the memory of the device. Those previously captured images may be processed to determine a number of subjects that occur a predetermined number of times within the image set. In other embodiments, the previously captured images may already have known subject data that may be utilized or shared to select the one or more known subjects in future image data capture cycles.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A depicts a conceptual example of an artificial neural network 100 that includes input neurons $x_1, x_2, x_3, \ldots, xn$, output neurons $y_1, y_2, y_3, \ldots, y_m$, and synapses 102 that connect input neurons $x_1, x_2, x_3, \ldots, xn$ to output neurons $y_1, y_2, y_3, \ldots, y_m$. In an embodiment, each synapse 102 has a corresponding weight $w11, w12, w13, \ldots, w_{nm}$.

In an embodiment, each input neuron $x1, x2, x3, \ldots, xn$ has an associated value, each output neuron $y_1, y_2, y_3, \ldots, y_m$ has an associated value, and each weight $w_{11}, w_{12}, w_{13}, \ldots, w_{nm}$ has an associated value. The value of each output neuron $y_1, y_2, y_3, \ldots, y_m$ may be determined as follows:

$$y_k = \sum_{j=1}^{n} x_j w_{kj}, k = 1, 2, \ldots, m \qquad (1)$$

In matrix notation, equation (1) may be written as $y=x^T W$, where y is an m-element output vector, x is an n-element input vector, and W is an n×m array of weights, as depicted in FIG. 1B.

The matrix-vector multiplication operation depicted in FIG. 1B may be implemented by utilizing multiplication and accumulation operations, in which each output neuron $y_1, y_2, y_3, \ldots, y_m$ has an associated value equal to the sum of products of each input neuron $x_1, x_2, x_3, \ldots, xn$ with the corresponding weight $w_{11}, w_{12}, w_{13}, \ldots, w_{nm}$ that connects each respective input neuron $x_1, x_2, x_3, \ldots, x_n$ to the output neuron $y_1, y_2, y_3, \ldots, y_m$.

Figure 1C:
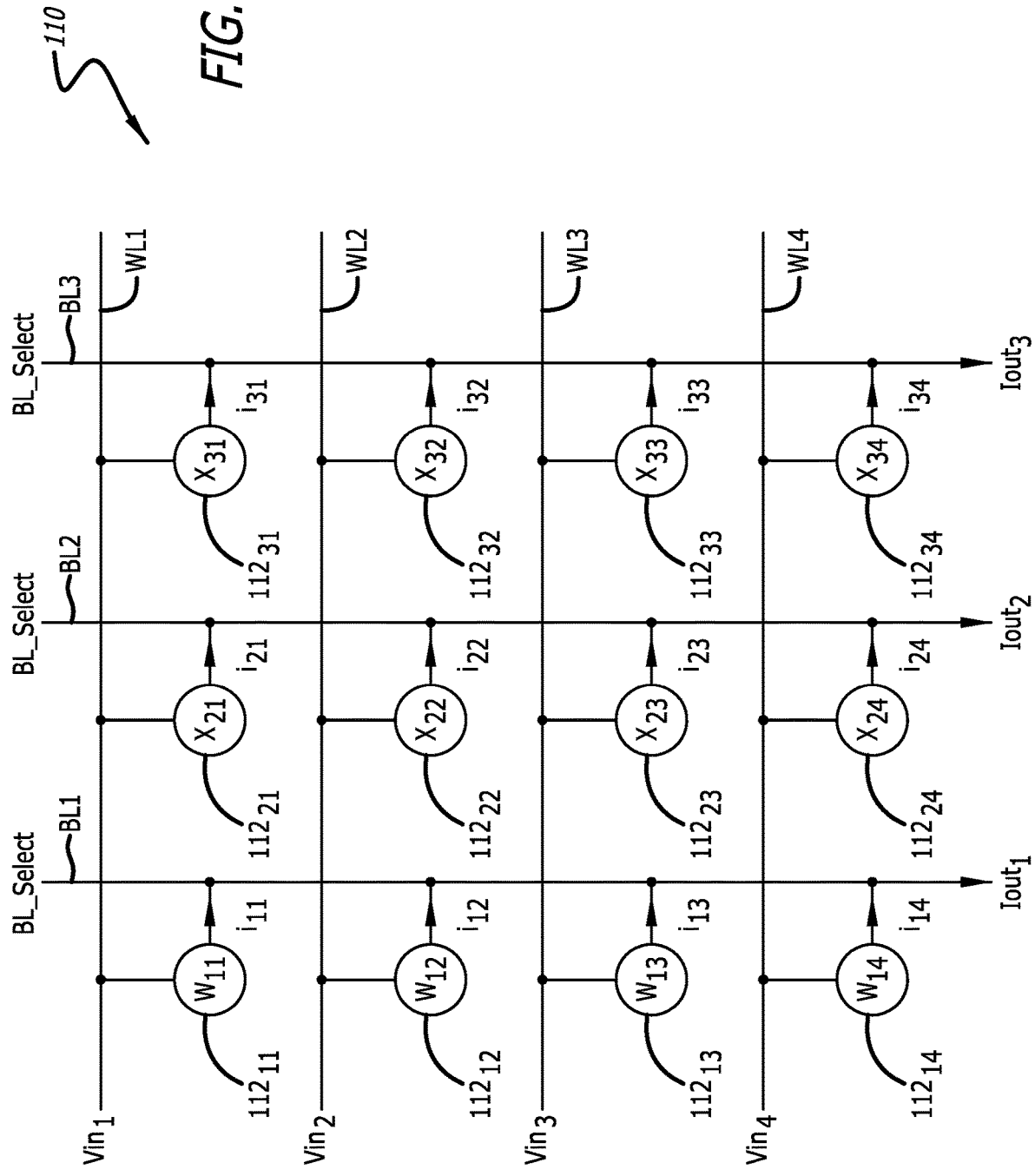
FIG. 1C is an example cross-point memory array suitable for performing the matrix-vector multiplication operation depicted in FIG. 1B in accordance with various embodiments of the disclosure is shown in accordance with an embodiment of the disclosure.

In a number of embodiments, a cross-point memory array can be used to perform the multiplication and accumulation operations described above. Referring to FIG. 1C, an example cross-point memory array suitable for performing the matrix-vector multiplication operation in accordance with various embodiments of the disclosure is shown. In many embodiments, the cross-point memory array 110 that may be utilized to perform matrix-vector multiplication operations such as those depicted in FIG. 1B.

In various embodiments, the cross-point memory array 110 may include n rows and m columns of nodes 112$_{11}$, 112$_{12}$, . . . , 112$_{34}$. Each row of these nodes 112$_{11}$, 112$_{12}$, . . . , 112$_{34}$ can be coupled to one of n first conductive lines (e.g., word lines (WL1, WL2, WL3, WL4). Additionally, each column of nodes 112$_{11}$, 112$_{12}$, . . . , 112$_{34}$ is coupled to one of m second conductive lines (e.g., bit lines BL1, BL2, BL3). Those skilled in the art will understand that cross-point memory arrays may include more or fewer than four word lines, and as well as fewer than three bit lines, and can have more or fewer than twelve nodes as depicted herein.

In certain embodiments, each node 112$_{11}$, 112$_{12}$, . . . , 112$_{34}$ of a cross-point memory array 110 may include a non-volatile memory cell having an adjustable resistance. In further embodiments, the non-volatile memory cells in nodes 112$_{11}$, 112$_{12}$, . . . , 112$_{34}$ may be programmed to store a corresponding weight of an n×m array of weights $w_{11}, w_{12}, w_{13}, \ldots, w_{34}$, respectively. Thus, each node 112$_{11}$, 112$_{12}$, . . . , 112$_{34}$ is labeled with a corresponding weight $w_{11}, w_{12}, w_{13}, \ldots, w_{34}$, respectively, programmed in the corresponding non-volatile memory cell of the node. In an embodiment, each weight $w_{11}, w_{12}, w_{13}, \ldots, w_{34}$ corresponds to a conductance of the non-volatile memory cell in each node $112_{11}$, $112_{12}$, ..., $112_{34}$, respectively. The weights may be programmed, for example, during a training phase of the neural network. A common training method involves the weights being selectively and/or iteratively updated using an algorithm such as, but not limited to, back propagation.

Input voltages $Vin_1$, $Vin_2$, $Vin_3$ and $Vin_4$ are shown applied to word lines WL1, WL2, WL3, WL4, respectively. The magnitudes of input voltages $Vin_1$, $Vin_2$, $Vin_3$ and $Vin_4$ can correspond to the associated values of input neurons $x_1$, $x_2$, $x_3$ and $x_4$, respectively. A bit line select voltage (BL Select) can be applied to each bit line to select that bit line. For ease of explanation, it will be assumed that BL Select is zero volts, such that the voltage across the non-volatile memory cell in each node $112_{11}$, $112_{12}$, ..., $112_{34}$ is the word line voltage.

In some embodiments, the non-volatile memory cells in nodes $112_{11}$, $112_{12}$, ..., $112_{34}$ conduct currents $i_{11}$, $i_{12}$, ..., $i_{34}$, respectively. Each of the currents $i_{11}$, $i_{12}$, ..., $i_{34}$ is based on the voltage applied to the corresponding non-volatile memory cell and the conductance of the corresponding non-volatile memory cell in the node. This "memory cell current" may then flow to the bit line connected to the non-volatile memory cell. The memory cell current can often be determined by multiplying the word line voltage by the conductance of the non-volatile memory cell.

Stated another way, each non-volatile memory cell current corresponds to the result of multiplying one of the elements of an input vector by the weight stored in the non-volatile memory cell. So, for example, a non-volatile memory cell in node $112_{11}$ conducts a current $i_{11}$ that corresponds to the product $Vin_1 \times w_{11}$, the non-volatile memory cell in node $112_{12}$ conducts a current $i_{12}$ that corresponds to the product $Vin_2 \times w_{12}$, the non-volatile memory cell in node $112_{23}$ conducts a current $i_{23}$ that corresponds to the product $Vin_3 \times w_{23}$, and so on.

Bit lines BL1, BL2, BL3 may conduct bit line currents $Iout_1$, $Iout_2$, $Iout_3$, respectively. Each bit line current can be understood as the summation of the currents of the memory cells connected to that bit line. For example, bit line current $Iout1 = i_{11} + i_{12} + i_{13} + i_{14}$, bit line current $Iout_2 = i_{21} + i_{22} + i_{23} + i_{24}$, and bit line current $Iout_3 = i_{31} + i_{32} + i_{33} + i_{34}$. Thus, each bit line current $Iout_1$, $Iout_2$, $Iout_3$ may be viewed as representing a sum of products of the input vector with corresponding weights in a column of the n×m array of weights:

The magnitudes of bit line currents $Iout_1$, $Iout_2$ and $Iout_3$ may constitute elements of an output vector and correspond to the associated values of output neurons $y_1$, $y_2$ and $y_3$, respectively. This can thus constitute the result of a matrix-vector multiplication operation such as the one depicted in FIG. 1B.

Figure 2:
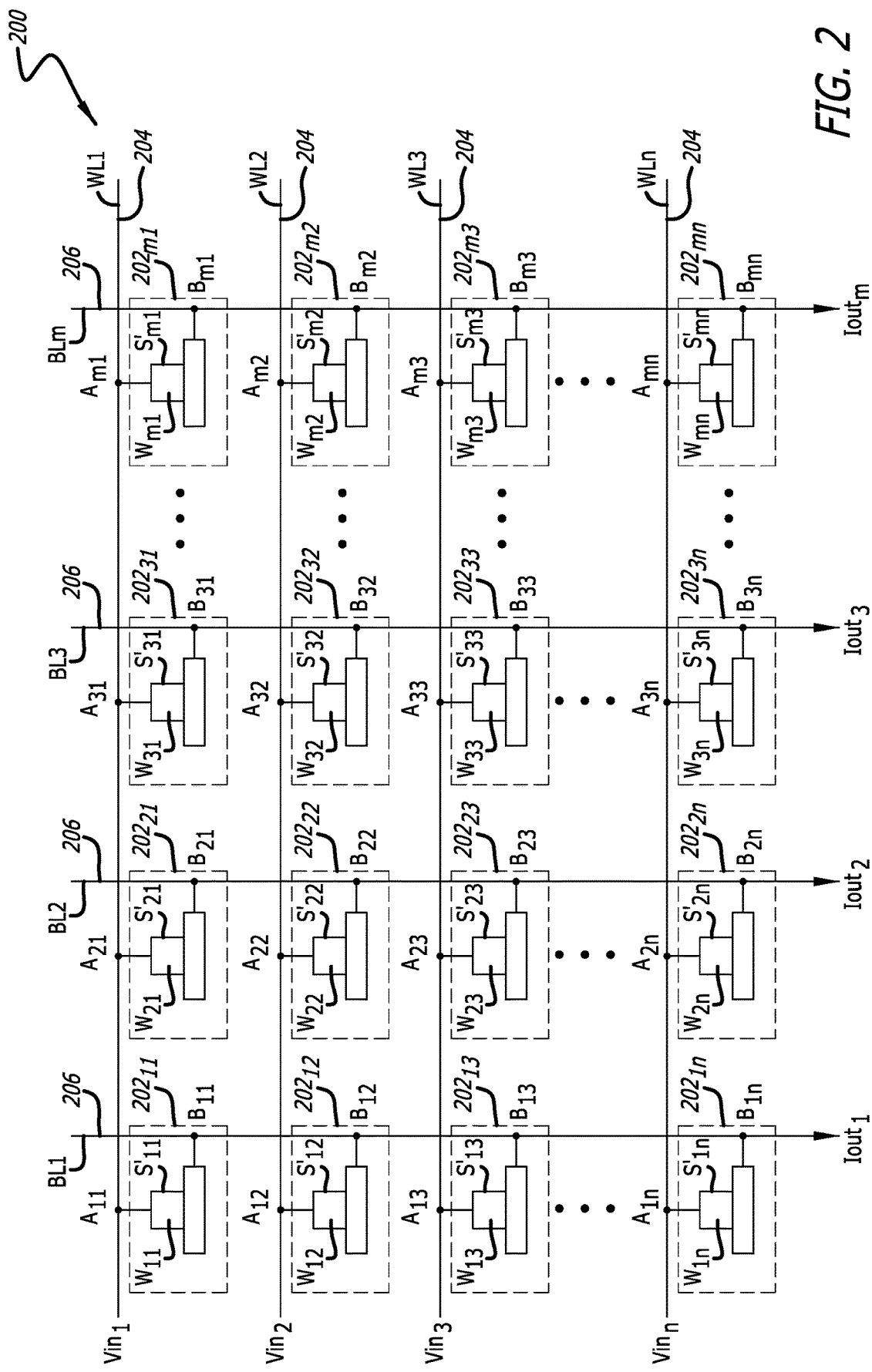
FIG. 2 is conceptual cross-point memory array that may be utilized within a low-power fast-response machine learning system according to various embodiments of the disclosure.

Referring to FIG. 2, a conceptual cross-point memory array 200 that may be utilized within a low-power fast-response machine learning system according to various embodiments of the disclosure is shown. In many embodiments, the cross-point memory array 200 depicted in FIG. 2 may be utilized to perform matrix-vector multiplication operations such as those depicted in FIG. 1B. Often, the cross-point memory array can be configured for use within a memory system and/or a specialized processing unit. Various embodiments of the disclosure herein utilize a cross-point memory array 200 for use in low-power, fast-response machine learning systems for the generation of a plurality of inferences regarding image data in a short amount of time.

Cross-point memory array 200 can include n rows and m columns of nodes $202_{11}$, $202_{12}$, ..., $202_{mn}$. In most embodiments, each of the nodes $202_{11}$, $202_{12}$, ..., $202_{mn}$ can include a corresponding non-volatile memory cell $S'_{11}$, $S'_{12}$, ..., $S'_{mn}$, respectively. In other embodiments, the cross-point memory array 200 may include more than one non-volatile memory cell per node.

Each row of nodes $202_{11}$, $202_{12}$, ..., $202_{mn}$ may be coupled to one of n first conductive lines 206, also referred to herein as word lines WL1, WL2, ..., WLn 204. For example, in the embodiment depicted in FIG. 2, the row of nodes $202_{11}$, $202_{21}$, $202_{31}$, ..., $202_{m1}$ is coupled to word line WL1, the row of nodes $202_{13}$, $202_{23}$, $202_{33}$, ..., $202_{m3}$ is coupled to word line WL3, and so on.

In further embodiments, each column of nodes $202_{11}$, $202_{12}$, ..., $202_{mn}$ may also be coupled to one of m second conductive lines 206, also referred to herein as bit lines BL1, BL2, ..., BLm. For example, as depicted in FIG. 2, the column of nodes $202_{11}$, $202_{12}$, $202_{13}$, ..., $202_{1n}$ is coupled to bit line BL1, the column of nodes $202_{21}$, $202_{22}$, $202_{23}$, ..., $202_{2n}$ is coupled to bit line BL2, and so on.

Each non-volatile memory cell $S'_{11}$, $S'_{12}$, ..., $S'_{mn}$ can be configured with a first terminal $A_{11}$, $A_{12}$, ..., $A_{mn}$, respectively, coupled to one of the n word lines WL1, WL2, ..., WLn, and a second terminal $B_{11}$, $B_{12}$, ..., $B_{mn}$, respectively, which is further coupled to one of the m bit lines BL1, BL2, ..., BLm. To simplify this disclosure and to avoid overcrowding the diagram, access devices are not depicted in FIG. 2.

In a number of embodiments, each non-volatile memory cell $S'_{11}$, $S'_{12}$, ..., $S'_{mn}$ is an Spin Orbit Torque (SOT) MRAM non-volatile memory cell. Low-power, fast-response machine learning techniques that can be utilized in accordance with embodiments of the disclosure are described in U.S. application Ser. Nos. 17/172,155, 17/172,175, and 17/172,190, which are hereby incorporated by reference in their entirety. In various embodiments, and as outlined in the above referenced related applications, it is contemplated that other configurations of cross-point memory arrays may be utilized. For example, the cross-point array 200 depicted in FIG. 2 utilizes two-terminal SOT MRAM non-volatile memory cells while other configurations may utilize three-terminal cells.

In many embodiments, the cross-point memory array 200 can operate in a programming phase (for programming) and inferencing phase (for generating inferences). During the programming phase, each SOT MRAM non-volatile memory cell $S'_{11}$, $S'_{12}$, ..., $S'_{mn}$ can be programmed to store a corresponding weight of an n×m array of weights $w_{11}$, $w_{12}$, $w_{13}$, ..., $w_{nm}$, respectively. In particular, each SOT MRAM non-volatile memory cell $S'_{xx}$ is often programmed by applying electrical current pulses from first terminal $A_{xx}$ to second terminal $B_{xx}$. Both programming and inferencing phases can run current pulses from first terminal A, to second terminal $B_{xx}$, but programming typically runs higher current than inferencing.

During inferencing, SOT MRAM non-volatile memory cells $S'_{11}$, $S'_{12}$, ..., $S'_{mn}$ of cross-point memory array 200 can be operated as described within the above related applications. In particular, during the inferencing phase each SOT MRAM non-volatile memory cell $S'_{11}$, $S'_{12}$, ..., $S'_{mn}$ conducts a memory cell current that corresponds to the result of multiplying one of the elements of the n-element input vector (multiply vector) by the corresponding weight stored in the non-volatile memory cell.

For example, SOT MRAM non-volatile memory cell $S'_{11}$ can conduct a memory cell current that corresponds to the product $Vin_1 \times w_{11}$, while SOT MRAM non-volatile memory cell $S'_{12}$ conducts a memory cell current that corresponds to the product $Vin_2 \times w_{12}$, and SOT MRAM non-volatile memory cell S'23 conducts a memory cell current that corresponds to the product $Vin_3 \times w_{23}$, and so on.

During the inferencing phase, the memory cell currents in SOT MRAM non-volatile memory cells $S'_{11}, S'_{12}, \ldots, S'_{mn}$ can flow to the bit line BL1, BL2, ..., BLm connected to the memory cell. Bit lines BL1, BL2, ..., BLm may conduct bit line currents $Iout_1, Iout_2, \ldots, Iout_m$, respectively. Each bit line current is typically the summation of the memory cell currents of the memory cells connected to that bit line.

In the embodiments described above, cross-point memory arrays such as cross-point memory array 200 (FIG. 2) have been used to implement a single layer of an artificial neural network 200 that includes input neurons $x_1, x_2, x_3, \ldots, x_n$, output neurons $y_1, y_2, y_3, \ldots, y_m$, and synapses as nodes 202 that connect input neurons $x_1, x_2, x_3, \ldots, x_n$ to output neurons $y_1, y_2, y_3, \ldots, y_m$. It is contemplated that multi-layer artificial neural networks may be implemented by cascading cross-point memory arrays so that an output of a first cross-point memory array can be used as one or more inputs to a second cross-point memory array, and so on.

In addition, in the embodiments described above, cross-point memory array 200 (FIG. 2) has been described as being configured to implement a binary neural network in which each SOT MRAM non-volatile memory cell in the array stores a binary weight, n binary inputs are applied to the first conductive lines, and m binary outputs are generated at the second conductive lines. It is further contemplated and would be understood by one skilled in the art that additional circuitry may be used to perform operations such as shift and add to achieve multiple-bit capabilities for the weight matrix for higher precision.

Without being bound by any particular scale, it is believed that embodiments of the cross-point memory arrays described above may achieve relatively fast speed as a result of various factors including, but not limited to, parallel in-memory computing without moving data between a processor and memory. Additionally, it is believed that many embodiments of the cross-point memory arrays described above may achieve relatively low power consumption due to the non-volatile memory nature of MRAM-like elements. This relatively low-power and fast-response can allow for unique and novel applications and improvements to computing devices and their associated technological field. For example, the following figures depict how these embodiments may be utilized to generate image calibration data when receiving and processing image data such as, but not limited to, pictures taken with a mobile computing device.

Figure 3:
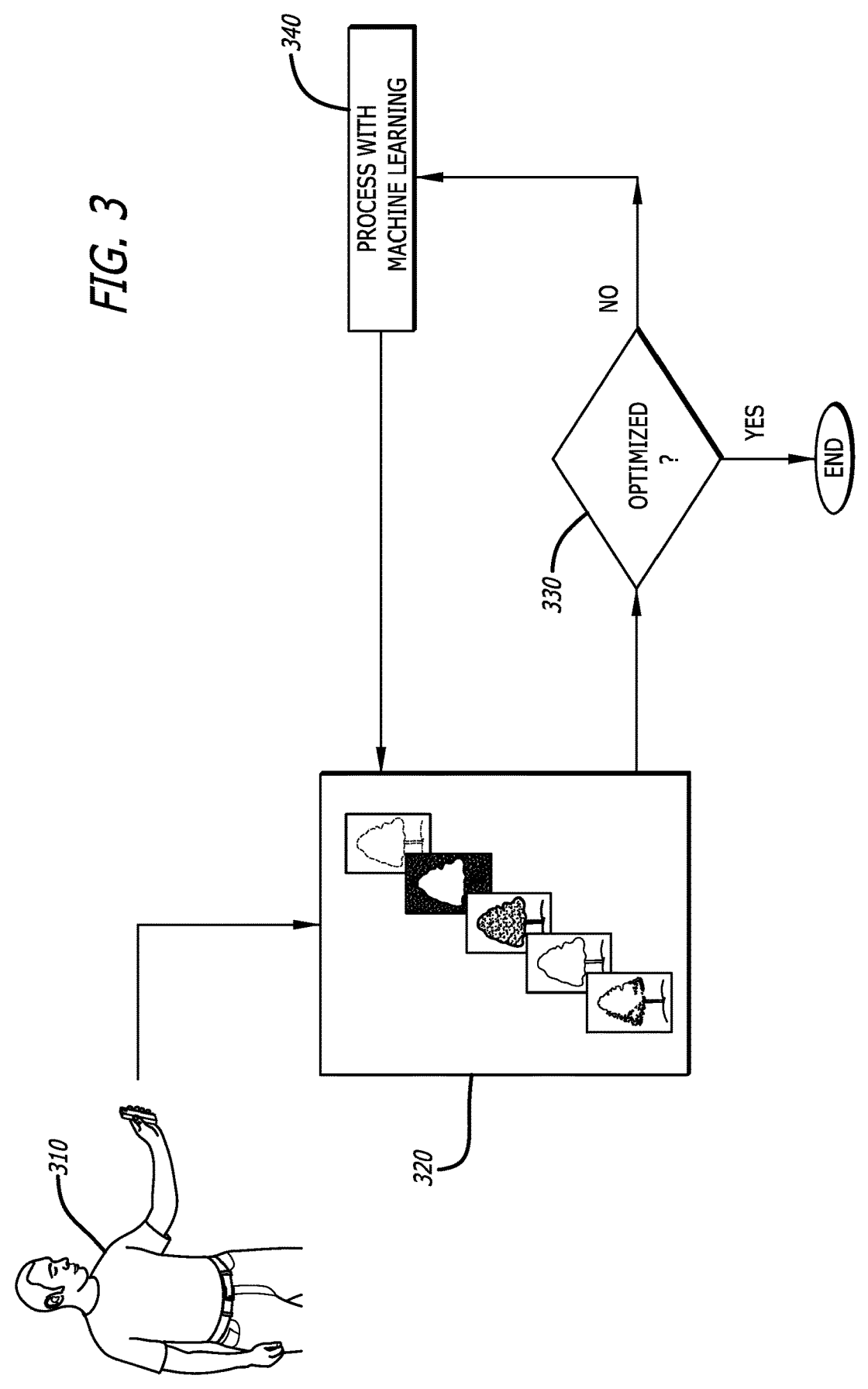

Referring to FIG. 3, the conceptual process of generating optimized image data in accordance with an embodiment of the disclosure is shown. As discussed in more detail in the subsequent discussion of FIGS. 4-8, many embodiments of the disclosure utilize a machine learning based optimization loop to generate optimized images. An example of this optimization loop is depicted in FIG. 3 in response to a user 310 taking a picture with a mobile computing device.

In response to the user 310 initiating the taking of a picture on the mobile computing device, an image sensor or image sensor array within the device can be directed to take a series of image data 320 which can represent various aspects of the image to be captured. Depending on the number and/or types of sensors available in the mobile computing device, a series of image data captured can include, but is not limited to, an auto exposed image, an auto white balance image, an autofocused image, a noise reduced image, a local tone mapped image, a highlighted details image, a fused image, a face detected image, a facial landmarked image, a segmented image, and/or a depth image. In certain embodiments, one or more of the series of image data 320 can be generated based on other captured image data which may be internally generated by the image sensor prior to passing to the memory and/or processor of the mobile computing device. In further embodiments, the mobile computing device may have a specialized system or logic to pre-process received image data to deliver additionally processed image data to the processor and/or memory for further processing.

Upon generation of the series of image data 320, one or more logics within the mobile computing device can determine if the image has been optimized 330. In response to the determination that the image data is optimized, the loop can end. In many embodiments described herein, the determination of optimization is based upon the analysis of one or more areas of the image data that are associated with one or more known subjects. When the captured series of image data 320 is not optimized, the image data can be processed with machine learning logic 340. Various embodiments of machine learning processing are described in the subsequent discussion of FIGS. 4-8.

In many embodiments, the machine learning logic can analyze the image data to determine if a known subject is within the image data. The image data may be out of focus on the known subject, which results in a non-optimized image. The machine learning logic can then generate one or more image sensor configuration changes that can be directed to the image sensor for capturing more image data utilizing the machine learning generated configuration changes. As described in more detail below, the number and type of configuration changes can depend on the type of image sensors and other data generating sensors available to the machine learning logic. This image capture, analysis, and reconfiguration loop can repeat for a particular number of cycles, or end upon the capture of an optimized image.

Figure 4:
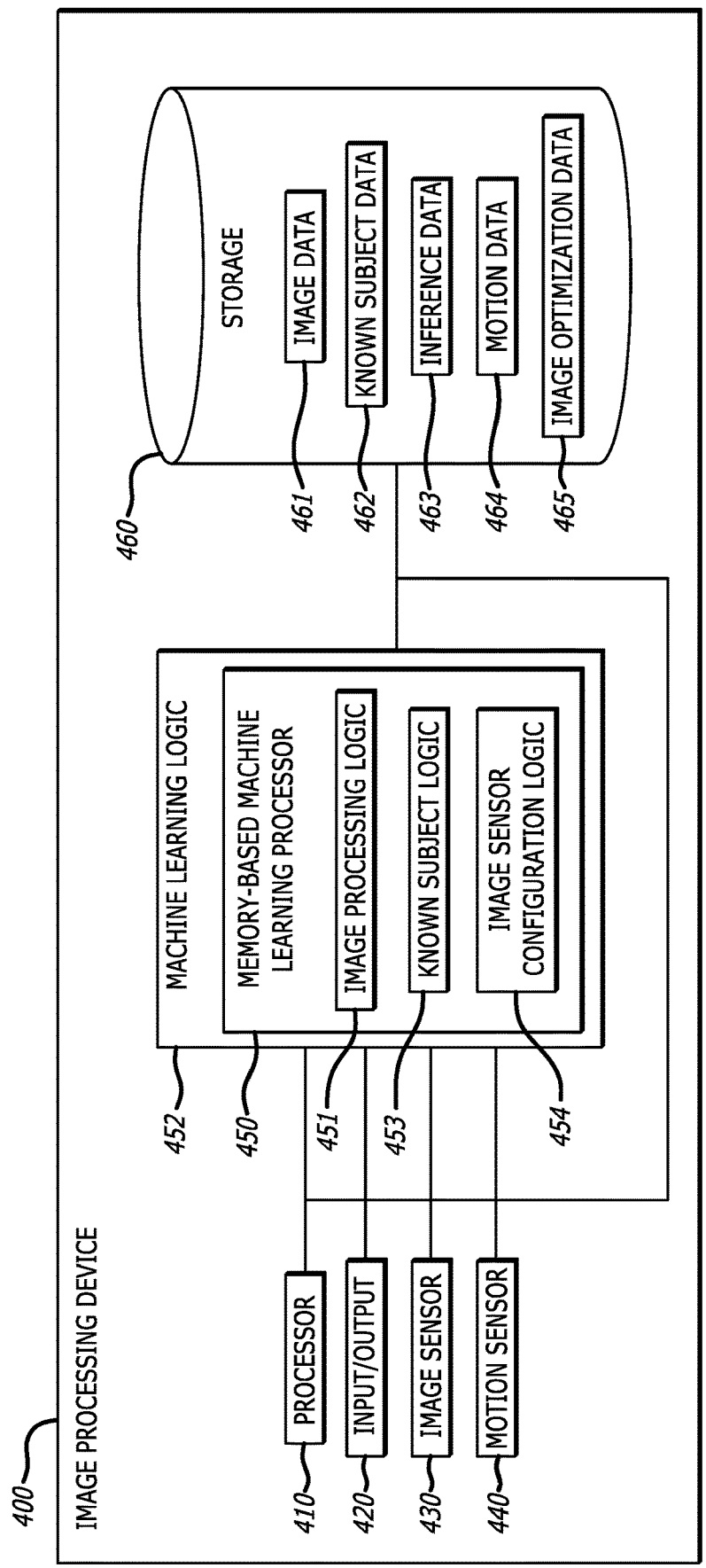
FIG. 4 is a conceptual schematic diagram of a device suitable for processing optimized image data utilizing low-power fast-response machine learning models in accordance with an embodiment of the disclosure.

Referring to FIG. 4, a conceptual schematic diagram of an image processing device 400 suitable for processing optimized image data utilizing low-power fast-response machine learning models in accordance with an embodiment of the disclosure is shown. Various embodiments of the image processing device 400 can include components such as, but not limited to, a processor 410, an input and output module 420 which may include a plurality of data input and output pathways, an image sensor 430, a motion sensor 440, a memory-based machine learning (ML) processor 450, and a storage 460. The memory-based ML processor 450 could be based on the cross-point memory array designs shown above, and could include associated control circuitry and analog-to-digital (ADC) to convert received digital signal into the analog domain for processing in the memory array, and digital-to-analog (DAC) to convert analog output from the memory array back into the digital domain. The memory-based ML processor 450 could be configured to implement a plurality of logics 451 and 453-454 while the storage 460 is configured to store a plurality of data 461-465.

In a number of embodiments, the memory-based ML processor 450 is part of and controlled by a machine learning logic 452 that can utilize one or more fast-response, low-power artificial neural networks to generate a plurality of inferences in a manner similar to the discussions of FIGS. 1A-2 above. In certain embodiments, the machine learning logic 452 can also include hardware and/or software logic to format, parse, or otherwise input data into the cross-point memory array of the memory-based ML processor 450 and to process the resultant output. In still additional embodiments, the machine learning logic 452 may be implemented as a specialized system on a chip SoC that is configured for specialized processing of image data.

The image sensor 430 may be configured in a variety of ways based on the application desired. In certain embodiments, the image sensor 430 may be an image sensor array comprising multiple lens and image sensor types. The image sensor 430 may be preinstalled image sensors on mobile computing devices. By way of example, the image sensor 430 can include a wide lens, an ultra-wide lens, a telephoto lens, and a light detection and ranging (LiDAR) camera. The various lenses may be provided on a single image sensor or may be disposed individually on separate image sensors within an image sensor array. In some embodiments, the image sensor 430 can be externally or remotely connected to the image processing device 400.

In many embodiments, an image processing logic 451 can guide the image processing process through various steps. By way of example, the image sensor 430 can provide image data, or a series of image data to the memory-based machine learning (ML) processor 450 for processing. The image processing logic 451 can pass and/or direct the received image data to a machine learning logic 452 for the generation of a plurality of inferences, to the known subject logic 453 for determining whether one or more known subjects are within the image data. In various embodiments, the image processing logic 451 can determine if the received image data is optimized, and when optimized, store the image data 461 within the storage 460.

In various embodiments, known subject logic 453 may be configured to utilize any known subject data 462 for recognizing a plurality of known subjects within a set of image data received for processing. The known subject logic 453 may be configured to create new known subject data 462 by receiving input data from a user indicating a particular subject within a series of image data is a known subject. In more embodiments, the known subject logic 453 may be directed to comb through or otherwise access a data store of pre-processed images that may allow for the determination of one or more known subjects. For example, a user may allow the known subject logic 453 access to a camera roll of a mobile computing device which may have multiple pictures of subjects known to the user. The known subject logic 453 may be able to determine the frequency of these subjects and generate new known subject data 462 that can be stored for future image data processing.

In further embodiments, image sensor configuration logic 454 can be utilized to provide one or more image sensor configurations to the image sensor 430. The image sensor 430 may be configurable through one or more settings. For example, shutter speed, focus, focal length, timings, data transfer speeds, etc. may all be configured within the image sensor 430 to change the image data captured. In various embodiments, the one or more configurations may be issued to the image sensor 430 to capture more optimized image data. The image sensor configuration logic 454 can provide the one or more configurations to the image sensor 430 to facilitate these subsequent captures.

In various embodiments, the image sensor configuration logic 454 can translate inference data 463 generated by the machine learning logic 452 to generate image optimization data 465 which can include one or more image sensor configurations. In certain embodiments, the image optimization data 465 can include only image sensor configurations. In further embodiments, the image sensor configuration logic 454 may also process motion data 464 to generate image optimization data 465. By utilizing the motion data 464, the image sensor configuration logic 454 can generate image sensor configurations that account for motion occurring to the image sensor 430 and thereby compensate for that as needed. In some embodiments, the processing of the image sensor configuration logic 454 may accomplished by the image processing logic 451 or another logic within the image processing device 400, such as processor 410. The processor 410 may also be used to implement part or all of image processing logic 451 and known subject logic 453.

In most embodiments, image data 461 can include any data that is captured and/or provided by the image sensor 430. Image data 461 can also include optimized image data that has been stored upon the completion of the optimization loop as described in FIG. 3. Image data 461 can be standard pixel color data, but may include a variety of data that can be captured by an image sensor 430 and may also include metadata associated with data captured by an image sensor 430 or processed by the image processing device 400. As those skilled in the art will recognize, the image data 461 may be located in a storage 460 within the image processing device 400 or may be stored within a removable and/or remote (i.e., "cloud-based") storage system.

In additional embodiments, known subject data 462 may include data that allows for the recognition of known subjects within image data 461 that is being processed. In some embodiments, the known subject data may be pixel data of various known subjects at differing angles, but may include other identifying data which may include, but is not limited to, segmentation data, or facial landmark data. As those skilled in the art will recognize, known subjects may not be limited to people and may be animals or other subjects that may be of interest to the user when capturing images.

In a number of embodiments, inference data 463 can be the output from one or more machine learning models processed by the machine learning logic 452. As discussed above, a fast-response, low-power machine learning system can be utilized to generate a plurality of inferences that can be grouped as inference data 463 for further processing. Inference data may be comprised of data that indicates the presence of a known subject within image data 461 or if the image data 461 is optimized, in-focus, etc. In some embodiments, the inference data 463 generated by the machine learning logic 452 may be immediately processed by another logic to generate further image optimization data 465 without being directly stored within the storage 460.

In still further embodiments, motion data 464 may indicate the current motion of the image sensor 430 or image processing device 400. In many embodiments, the motion data 464 is directly generated from a motion sensor 440 located within the image processing device 400 or adjacent/associated with the image sensor 430. Utilizing the motion data 464, the image processing logic 451 and/or the image sensor configuration logic 454 may account for movement during the image capture process which may inhibit the optimization of the image data 461. For example, the user may be moving the image processing device 400 (such as a mobile computing device) during image capture. This may create a blur or other distortions in the image data 461 being captured. The motion data 464 may be added to the inference data 463 in certain embodiments to generate image optimization data 465 which can attempt to compensate for this motion by issuing or modifying one or more image sensor configurations. Similar to other data 461-463, 465 the motion data 464 may not be stored directly within the storage 460 of the image processing device 400 but may be directly generated and processed by one or more logics 451, and 453-454 before being deleted.

In some embodiments, image optimization data 465 can include data generated upon parsing inference data 463 generated from the machine learning logic 452. In a variety of embodiments, the image optimization data 465 is a data processed by the image sensor configuration logic 454 which includes one or more image sensor configurations. As described in more detail below, the image optimization data 465 can include image sensor configurations which are generated to optimize one or more known subject areas within the image data 461. In some embodiments, the image optimization data 465 can be generated based on a combination of inference data 463 and motion data 464. The image optimization data 465 can often be parsed and processed by the image sensor 430 to capture subsequent image data 461. In other embodiments, the image optimization data 465 requires one or more logics to translate and/or issue commands to the image sensor 430.

Figure 5A:
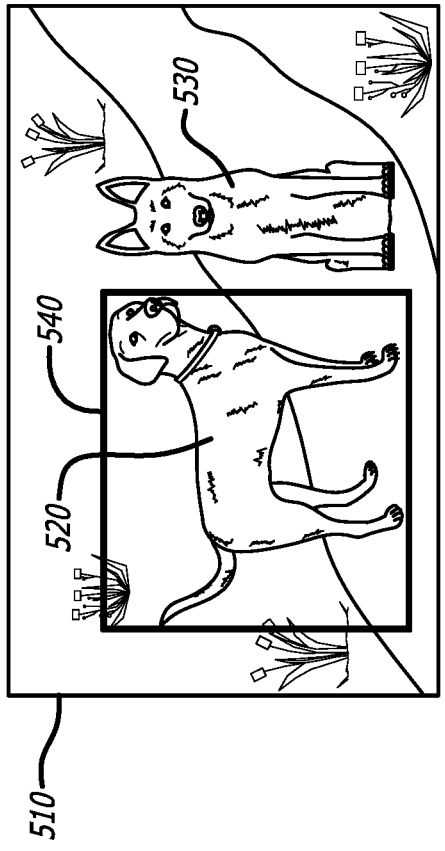
FIG. 5A is a conceptual illustration of an image with a known subject processed with a bounding box in accordance with an embodiment of the disclosure.

Referring to FIG. 5A, a conceptual illustration of an image 510 with a known subject 520 processed with a bounding box 540 in accordance with an embodiment of the disclosure is shown. To illustrate various embodiments described herein, FIG. 5A depicts a sample image taken of two dogs on a landscape. It may be the case that the left dog is a known subject 520 while the dog on the right is an unknown subject 530. The selection of a known subject can be represented by generating a bounding box 540 around the known subject 520 within the image 510. The bounding box 540 can be understood to be the smallest possible rectangle that encases the entire known subject 520. However, in certain embodiments, the bounding box 540 may be limited to a facial/bust area of a subject to maximize known subject detection. The bounding box 540 can then be an area selected for processing to determine if the image 510 has been optimized.

In certain embodiments, an unknown subject 530 may be a subject not known to the user, or may be a subject that has not either been explicitly selected for recognition by the user or has not been photographed enough with the image taking device to exceed a predetermined threshold of recognition. In additional embodiments, the determination of a known subject 520 within an image 510 can be based on previously stored known subject data within the image capturing device, such as a mobile computing device. In further embodiments, the image capturing device may have access to a cache of previously captured images that may serve as a source of determining the presence of known subjects or for the creation of a database of known subjects. The selection of known subjects may be generated by the presence of the subject within a predetermined number of pictures, or may be generated by the presence of a sufficient amount of data required to create a known subject profile. In still more embodiments, the determination of a known subject 520 may be manually accomplished by a user, sometimes in response to one or more prompts that indicate whether a selected subject is known or should be classified as known.

Figure 5B:
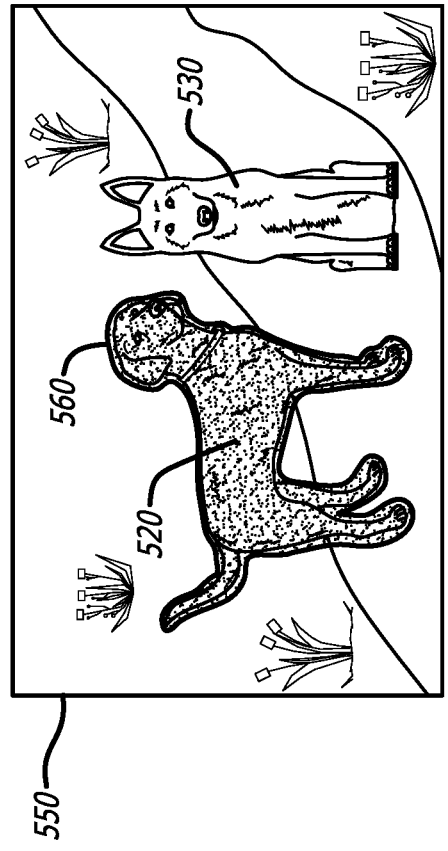
FIG. 5B is a conceptual illustration of an image with a known subject processed with a pixel mask in accordance with an embodiment of the disclosure.

Referring to FIG. 5B, a conceptual illustration of an image 550 with a known subject 520 processed with a pixel mask 560 in accordance with an embodiment of the disclosure is shown. As described above with reference to FIG. 5A, an image may comprise a known subject 520 and an unknown subject 530. The selection of the area that encases a known subject 520 for purposes of image optimization may occur in a variety of ways. FIG. 5A depicted a bounding box 540 that encased the full known subject 520. The embodiment depicted in FIG. 5B utilizes a pixel mask 560 that covers the entire known subject 520 on an exact, or near-exact pixel-level. In this sense, a mask is generated that closely matches the known subject. In this way, only the area of the known subject 520 is selected and is utilized to determine image optimization. Benefits of utilizing a pixel mask are more accurate optimizations, however the disadvantages include increased processing time and power to generate the pixel mask 560 compared to a bounding box 540.

Figure 6:
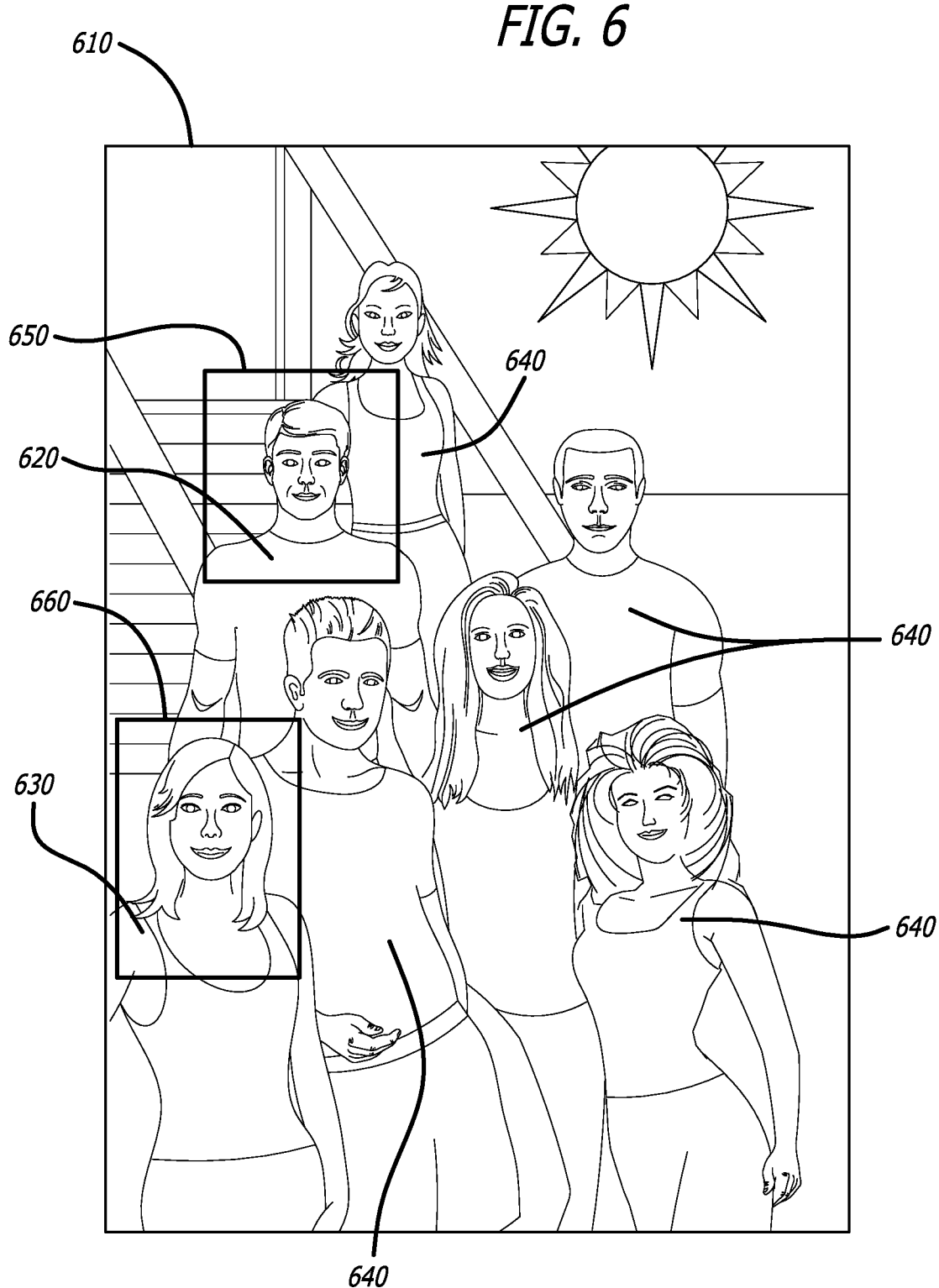
FIG. 6 is a conceptual illustration of an image processed with multiple known subjects in accordance with an embodiment of the disclosure.

Referring to FIG. 6, a conceptual illustration of an image 610 processed with multiple known subjects 620, 630 in accordance with an embodiment of the disclosure is shown. In a variety of embodiments, images may be captured that include multiple known subjects and unknown subjects. It may be the desire of a user to want an image 610 to be captured of the known subjects 620, 630, at the potential expense of the unknown subjects 640. In these embodiments, the image capturing device may generate two bounding boxes 650, 660 that encase a first known subject 620 and second known subject 630. As described above, the bounding boxes 650, 660 depicted in FIG. 6 are limited to the facial/bust region of the known subjects 620, 630. In this way, the optimization of the image 610 can be limited to their faces. It should be noted that although an image 610 may be taken and optimized based on the data associated with the one or more known subjects 620, 630, that doesn't automatically mean such optimization is done at the expense of the unknown subjects 640.

In many embodiments, images can be captured that may provide clarity in one portion of the image while sacrificing the quality of the image in another location of the frame. By determining and selecting one or more known subjects 620, 630 and generating a bounding boxed 650, 660 associated with them, can allow the image capturing system to be guided by a preference that if such quality decisions and/or tradeoffs are to be made while capturing the image, that those decisions or processing should focus or benefit the data within the known subjects bounding boxes 650, 660 over data outside. These determinations and preferences can further be utilized to continue the image capture process until a predetermined level of optimization is achieved. Although the image 610 depicted in FIG. 6 shows two known subjects, it is contemplated that images may be captured with additional known subjects which is only limited by the processing power available and/or the amount of image space utilized.

Figure 7:
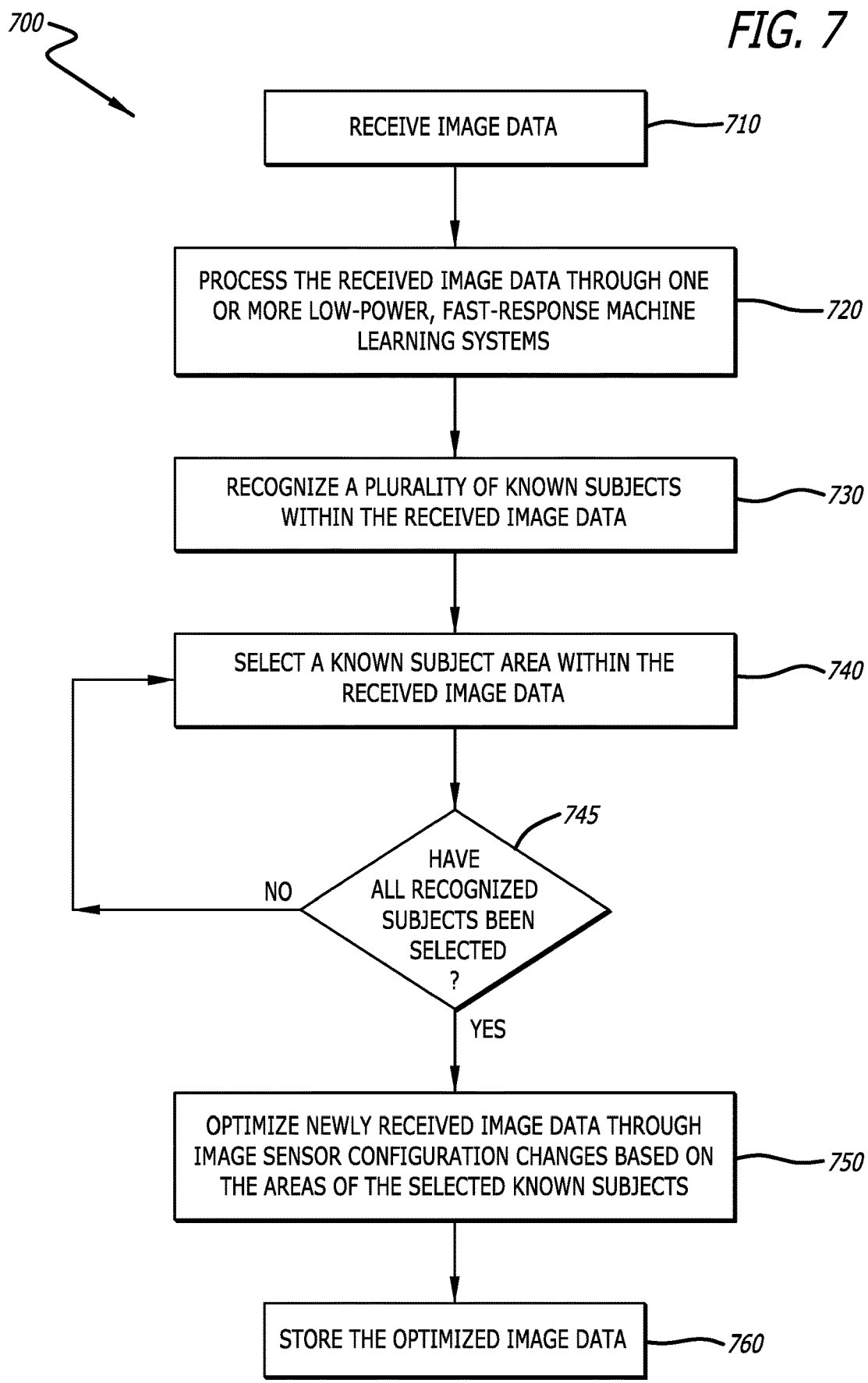
FIG. 7. is a flowchart depicting a process for optimizing image data with a plurality of known subjects in accordance with an embodiment of the disclosure.

Referring to FIG. 7, a flowchart depicting a process 700 for optimizing image data with a plurality of known subjects in accordance with an embodiment of the disclosure is shown. In many embodiments, image data is received for processing (block 710). The image data may be received by an image sensor or image sensor array. In certain embodiments, the image data may be received from a data file or from a remotely located image sensor. The received image data can be processed by one or more low-power, fast-response machine learning systems (block 720). As described above, the low-power, fast-response machine learning system can be an artificial neural network or other cross-point memory array such as those described above with respect to the discussion regarding FIGS. 1A-2.

The one or more machine learning systems can generate a plurality of inference data that can be utilized to recognize a plurality of known subjects within the received image data (block 730). In response to the recognition of a plurality of known subjects, the process 700 can in response select a known subject area within the received image data. As discussed in FIGS. 5A-5B, the known subject area can be processed as a boundary box, pixel mask, or other similar demarcations. In response to a selection being made, the process 700 can determine if all of the recognized subjects have been selected within the image data (block 745). When one or more recognized subjects have not been selected within the image data, the process 700 can again select another known subject area (block 740). When all recognized subjects have been selected, the process 700 can optimize the newly received image data through generating one or more image sensor configuration changes based on the areas of the selected known subjects (block 750). Once optimized, the image data can be stored within one or more storage devices (block 760).

Figure 8:
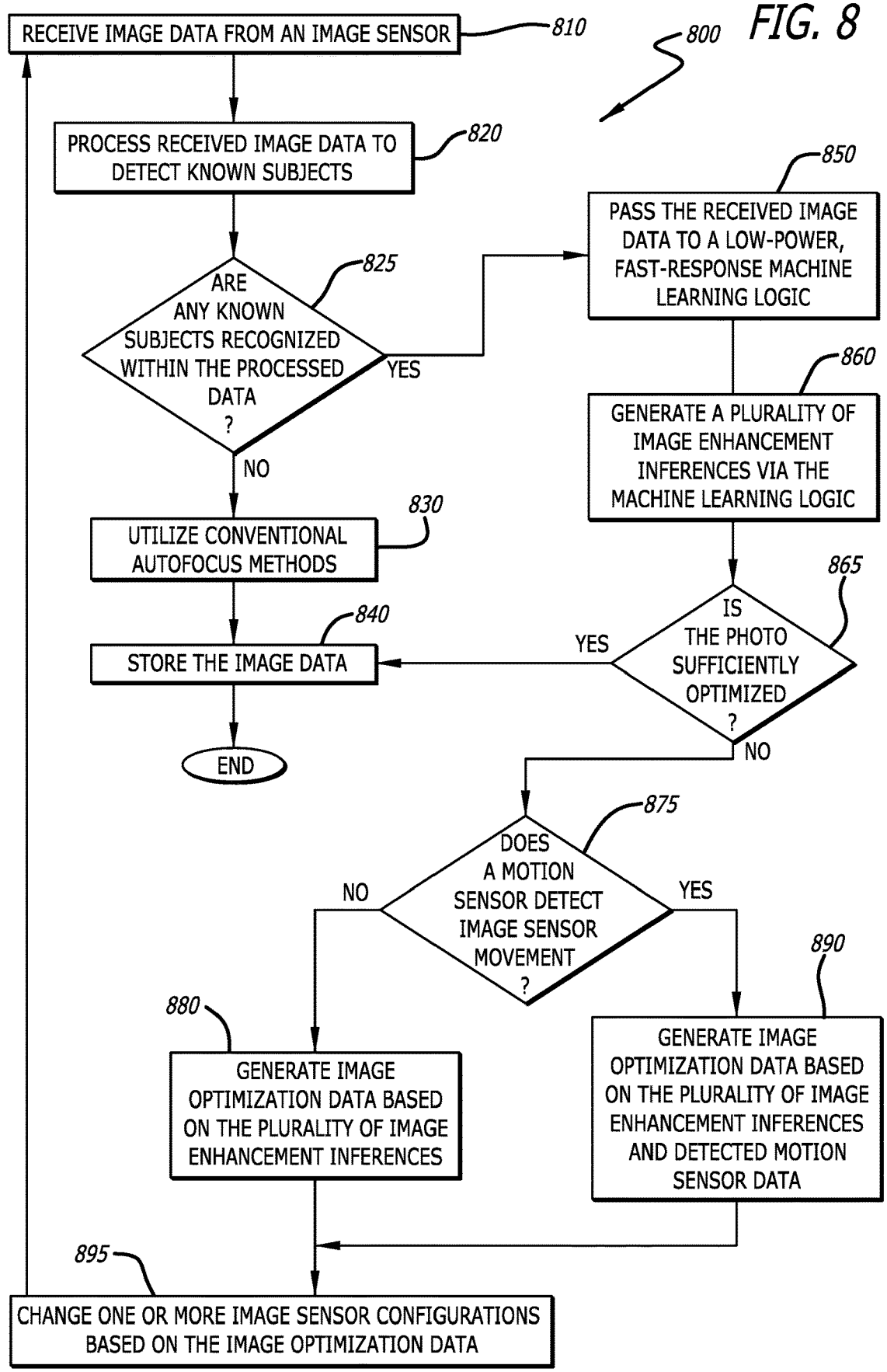
FIG. 8 is a flowchart depicting a process for utilizing fast-response low-power machine learning logic to optimize received image data in accordance with an embodiment of the disclosure.

Referring to FIG. 8, a flowchart depicting a process 800 for utilizing fast-response low-power machine learning logic to optimize received image data in accordance with an embodiment of the disclosure is shown. In many embodiments, the process 800 can commence upon receiving image data from an image sensor (block 810). As discussed previously, the image sensor may be configured within a mobile computing device including, but not limited to, a smart phone and/or a mobile tablet. The received image data can be processed to detect if one or more known subjects are within the image data (block 820). The process 800 can then determine if any know subjects are recognized within the processed image (block 825). If no known subjects are recognized within the image data, the process 800 can utilize one or more conventional autofocus methods to optimize the image data (block 830). As those skilled in the art will recognize, conventional autofocus methods may include, but are not limited to, phase and/or contrast detection method. Once optimized, the image data can then be stored (block 840).

In a variety of embodiments, when the process 800 determines that one or more known subjects are recognized within the processed image data, the image data is passed to a low-power, fast-response machine learning logic (block 850). the low-power, fast-response machine learning logic can be similar to those described above with respect to FIGS. 1-2 and 4. In a number of embodiments, the low-power, fast-response machine learning logic can generate a plurality of image enhancement inferences via the machine learning logic (block 860). In other words, the plurality of inferences can be utilized to optimize the image data. In most embodiments, the inferences are further configured to optimize the image data within one or more regions within the image data that corresponds to one or more of the known subjects that have been recognized. In certain embodiments, the low-power, fast-response machine learning logic may also be utilized to perform the subject recognition, autofocusing, and/or the image area selection steps of the process 800.

Once the inferences are generated, the process 800 can determine if the photograph within the image data is sufficiently optimized (block 865). It is contemplated that image data may comprise more than just a photograph. This can include, but is not limited to, metadata, depth maps, supplemental image channels, etc. If it is determined that the image data is sufficiently optimized, the process 800 can then store the image data (block 845). In a variety of embodiments, the determination of whether image data is sufficiently optimized occurs prior to the generation of inferences from the low-power, fast-response machine learning logic.

In response to the determination that the image data and/or photograph is not sufficiently optimized, the process 800 can further determine if a motion sensor detects image sensor movement (block 875). As can be understood by those skilled in the art, an image sensor disposed within a mobile computing device can be moved about during the process of capturing image data. This movement may change the potential for optimizing an image during capture. To compensate for this potential movement, various changes to an image sensor may be made. In response to the determination is that motion is occurring during the image capture process by receiving motion sensor data, the process 800 can generate image optimization data based on the plurality of image enhancement inference and detected motion sensor data (block 890). Based upon both types of data, the generated image optimization data can be utilized to change one or more image sensor configurations (block 895).

When the process 800 determines that a motion sensor does not detect image sensor movement, the generation of image optimization data can be based solely on the plurality of image enhancement inferences (block 880). It is contemplated that further embodiments may utilize other supplemental types of data for generating image optimization data beyond motion data. Similarly, the process 800 can change one or more image sensor configurations based on the image optimization data generated from the plurality of image enhancement inferences (block 895).

Upon changing the one or more sensor configurations, further image data can be captured. The process 800 can then wait from subsequent image data to be received from the changed image sensor (block 810). In many embodiments, this cycle can repeat until it is determined that the image data being captured is sufficiently optimized and the image data is stored within one or more storage devices (blocks 865, 840).

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:
1. A device, comprising:
   an image sensor;
   a Non-Volatile Memory (NVM) for storing data and executable instructions; and a processor communicatively coupled to the NVM, the processor being configured to direct the device to:
receive image data for processing;
pass the received image data to a machine learning model;
recognize a known subject within the image data;
generate a plurality of inferences via the machine learning model;
utilize the plurality of inferences to generate image optimization data;
wherein the image optimization data comprises one or more image sensor configurations for optimizing an area within the image data associated with the known subject during subsequent image data captures.

2. The device of claim 1, wherein the processor comprises a machine learning processor comprising a plurality of non-volatile memory cells to store weights for the machine learning model, and wherein the machine learning processor is configured to apply signals corresponding to the received image data, via one or more signal lines associated with the memory cells, to the memory cells, to generate the plurality of inferences.

3. The device of claim 2, wherein the non-volatile memory cells are Spin-Orbit Torque Magnetoresistive Random-Access Memory (SOT MRAM) memory cells.

4. The device of claim 1, further comprising a motion sensor, wherein the device is further configured to:
receive motion data from the motion sensor; and
generate the image optimization data based on the plurality of inferences and the received motion data.

5. The device of claim 1, wherein the device is configured to continue capturing image data until the optimization of the known subject within the image data exceeds a predetermined threshold.

6. The device of claim 5, wherein the image data is captured in discrete units.

7. The device of claim 6, wherein the device generates unique image optimization data between each discrete unit of image data captures.

8. The device of claim 5, wherein the predetermined threshold is related to the focus of the known subject within the image data.

9. The device of claim 1, wherein the device is further configured to recognize two or more known subjects within the image data and generate image optimization data comprising one or more image sensor configurations for optimizing areas of the image data associated with the two or more known subjects.

10. The device of claim 1, wherein the area associated with the known subject is a bounding box encasing the known subject.

11. The device of claim 1, wherein the area associated with the known subject is a mask covering the known subject.

12. A method for generating machine-learning based image optimization data, comprising:
receiving image data;
passing the received image data to a low-power, fast-response machine learning model;
recognizing one or more known subjects within the image data;
determining a known subject area for optimization based on the one or more known subjects;
generating a plurality of inferences via the machine learning model;
utilizing the plurality of inferences to generate image optimization data wherein the image optimization data comprises one or more image sensor configurations for optimizing the known subject area within the image data;
providing the image optimization data to an image sensor for capturing subsequent image data; and
processing subsequently received image data until a predetermined optimization threshold is exceeded.

13. The method of claim 12, wherein the optimization includes improving the focus of the known subject area.

14. The method of claim 12, wherein the low-power, fast-response machine learning model is executed in a plurality of Magnetoresistive Random-Access Memory (MRAM) based machine learning devices.

15. The method of claim 14, wherein the generation of the plurality of inferences is completed in less than one millisecond.

16. A device, comprising:
a Non-Volatile Memory (NVM) for storing data and executable instructions; and
a processor communicatively coupled to the NVM, the processor being configured to direct the device to:
receive image data for processing;
pass the received image data to a machine learning model;
recognize a known subject within the image data;
generate a plurality of inferences via the machine learning model;
utilize the plurality of inferences to generate image optimization data;
wherein the image optimization data comprises one or more image sensor configurations for optimizing image data capture areas associated with the known subject.

17. The device of claim 16, wherein the processor comprises a machine learning processor comprising a plurality of non-volatile memory cells to store weights for the machine learning model, and wherein the machine learning processor is configured to apply signals corresponding to the received image data, via one or more signal lines associated with the memory cells, to the memory cells, to generate the plurality of inferences.

18. The device of claim 16, wherein the non-volatile memory cells are Spin-Orbit Torque Magnetoresistive Random-Access Memory (SOT MRAM) memory cells.

19. The device of claim 16, wherein the image sensor comprises a plurality of varying focal length image sensors.

20. The device of claim 16, wherein the image sensor further comprises a Light Detection and Ranging (LiDAR) camera.

21. The device of claim 16, further comprises an image sensor array, wherein the image sensor array is disposed within a mobile computing device.

22. The device of claim 16, wherein the known subject is selected via an input received by the mobile computing device.

* * * * *